(12) United States Patent
Meneboo et al.

(10) Patent No.: US 12,137,536 B2
(45) Date of Patent: Nov. 5, 2024

(54) SYSTEMS AND METHODS FOR AUTONOMOUSLY ACTIVABLE REDUNDANT COOLING OF A HEAT GENERATING COMPONENT

(71) Applicant: OVH, Roubaix (FR)

(72) Inventors: Alexandre Alain Jean-Pierre Meneboo, Harnes (FR); Ali Chehade, Moncheaux (FR); Gregory Francis Louis Bauchart, Wattrelos (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/697,264

(22) Filed: Mar. 17, 2022

(65) Prior Publication Data

US 2022/0322570 A1   Oct. 6, 2022

(30) Foreign Application Priority Data

Apr. 1, 2021 (EP) .................................... 21305427
Aug. 30, 2021 (EP) .................................... 21306173

(51) Int. Cl.
H05K 7/20 (2006.01)

(52) U.S. Cl.
CPC ..... *H05K 7/20236* (2013.01); *H05K 7/20272* (2013.01); *H05K 7/20281* (2013.01)

(58) Field of Classification Search
CPC ........... H05K 7/20236; H05K 7/20772; H05K 7/20281; H05K 7/20272; H05K 7/20263; H05K 7/203; H05K 7/208
See application file for complete search history.

(56) References Cited

U.S. PATENT DOCUMENTS 2,115,501 A   4/1938   Sergius
2,316,296 A   4/1943   Simonds
(Continued)

FOREIGN PATENT DOCUMENTS

CN   201898432 U   7/2011
CN   103687443 A   3/2014
(Continued)

OTHER PUBLICATIONS

Office Action with regard to the counterpart U.S. Appl. No. 17/701,422 mailed Mar. 28, 2023.
(Continued)

*Primary Examiner* — Frantz F Jules
*Assistant Examiner* — Martha Tadesse
(74) *Attorney, Agent, or Firm* — BCF LLP

(57) ABSTRACT

A cooling system comprises a main cooling arrangement thermally coupled to the heat generating component, and configured for collecting thermal energy of the heat generating component via a main heat transfer fluid, and a backup cooling arrangement thermally coupled to the main cooling arrangement and comprising at least one fluid path configured for conducting a backup heat transfer fluid. The cooling system comprises a thermal fuse disposed within at least a portion of the at least one fluid path, the thermal fuse changing from a solid state to a melted state and selectively enabling a flow of the backup heat transfer fluid in the at least one fluid path of the backup cooling arrangement in response to its temperature being above a temperature threshold, the backup heat transfer fluid being configured to, upon flowing in the at least one fluid path, collect thermal energy from the main cooling arrangement.

20 Claims, 6 Drawing Sheets

(56) References Cited

U.S. PATENT DOCUMENTS

| | | |
|---|---|---|
| 3,938,689 A | 2/1976 | De Munnik |
| 4,279,966 A | 7/1981 | Wakana et al. |
| 4,619,316 A | 10/1986 | Nakayama et al. |
| 4,888,664 A | 12/1989 | Rojc |
| 5,268,814 A | 12/1993 | Yakubowski |
| 5,307,956 A | 5/1994 | Richter et al. |
| 5,669,524 A | 9/1997 | Loedel |
| 5,907,473 A | 5/1999 | Przilas et al. |
| 6,023,934 A | 2/2000 | Gold |
| 6,746,388 B2 | 6/2004 | Edwards et al. |
| 6,847,525 B1 | 1/2005 | Smith et al. |
| 6,883,593 B2 | 4/2005 | Johnson et al. |
| 6,899,164 B1 | 5/2005 | Li et al. |
| 7,369,410 B2 | 5/2008 | Chen et al. |
| 7,403,392 B2 | 7/2008 | Attlesey et al. |
| 7,414,845 B2 | 8/2008 | Attlesey et al. |
| 7,527,085 B2 | 5/2009 | Ijima et al. |
| 7,724,517 B2 | 5/2010 | Attlesey et al. |
| 7,885,070 B2 | 2/2011 | Campbell et al. |
| 7,900,796 B2 | 3/2011 | Ungrady et al. |
| 7,905,106 B2 | 3/2011 | Attlesey |
| 7,911,782 B2 | 3/2011 | Attlesey et al. |
| 7,911,793 B2 | 3/2011 | Attlesey |
| 8,009,419 B2 | 8/2011 | Attlesey et al. |
| 8,014,150 B2 | 9/2011 | Campbell et al. |
| 8,089,764 B2 | 1/2012 | Attlesey |
| 8,089,765 B2 | 1/2012 | Attlesey |
| 8,089,766 B2 | 1/2012 | Attlesey |
| 8,291,964 B2 | 10/2012 | Hwang et al. |
| 8,305,759 B2 | 11/2012 | Attlesey et al. |
| 8,467,189 B2 | 6/2013 | Attlesey |
| 8,619,425 B2 | 12/2013 | Campbell et al. |
| 8,654,529 B2 | 2/2014 | Tufty et al. |
| 8,934,244 B2 | 1/2015 | Shelnutt et al. |
| 8,953,317 B2 | 2/2015 | Campbell et al. |
| 9,049,800 B2 | 6/2015 | Shelnutt et al. |
| 9,051,502 B2 | 6/2015 | Sedarous et al. |
| 9,086,859 B2 | 7/2015 | Tufty et al. |
| 9,128,681 B2 | 9/2015 | Tufty et al. |
| 9,144,179 B2 | 9/2015 | Shelnutt et al. |
| 9,155,230 B2 | 10/2015 | Eriksen |
| 9,176,547 B2 | 11/2015 | Tufty et al. |
| 9,195,282 B2 | 11/2015 | Shelnutt et al. |
| 9,223,360 B2 | 12/2015 | Tufty et al. |
| 9,328,964 B2 | 5/2016 | Shelnutt et al. |
| 9,335,802 B2 | 5/2016 | Shelnutt et al. |
| 9,351,429 B2 | 5/2016 | Shelnutt et al. |
| 9,382,914 B1 | 7/2016 | Sharfi |
| 9,426,927 B2 | 8/2016 | Shafer et al. |
| 9,436,235 B2 | 9/2016 | Damaraju et al. |
| 9,464,854 B2 | 10/2016 | Shelnutt et al. |
| 9,529,395 B2 | 12/2016 | Franz et al. |
| 9,699,938 B2 | 7/2017 | Shelnutt et al. |
| 9,699,939 B2 | 7/2017 | Smith |
| 9,717,166 B2 | 7/2017 | Eriksen |
| 9,756,766 B2 | 9/2017 | Best |
| 9,773,526 B2 | 9/2017 | Shelnutt et al. |
| 9,781,859 B1 | 10/2017 | Wishman et al. |
| 9,795,065 B2 | 10/2017 | Shelnutt et al. |
| 9,839,164 B2 | 12/2017 | Shelnutt et al. |
| 9,844,166 B2 | 12/2017 | Shelnutt et al. |
| 9,921,622 B2 | 3/2018 | Shelnutt et al. |
| 9,968,010 B2 | 5/2018 | Shelnutt et al. |
| 9,992,914 B2 | 6/2018 | Best et al. |
| 10,010,013 B2 | 6/2018 | Shelnutt et al. |
| 10,018,425 B2 | 7/2018 | Shelnutt et al. |
| 10,020,242 B2 | 7/2018 | Katsumata et al. |
| 10,064,314 B2 | 8/2018 | Shelnutt et al. |
| 10,104,808 B2 | 10/2018 | Scharinger et al. |
| 10,130,008 B2 | 11/2018 | Shepard et al. |
| 10,143,113 B2 | 11/2018 | Shelnutt et al. |
| 10,143,114 B2 | 11/2018 | Shelnutt et al. |
| 10,146,231 B2 | 12/2018 | Shelnutt et al. |
| 10,149,408 B2 | 12/2018 | Fujiwara et al. |
| 10,156,873 B2 | 12/2018 | Shelnutt et al. |
| 10,172,262 B2 | 1/2019 | Shelnutt et al. |
| 10,206,312 B2 | 2/2019 | Shelnutt et al. |
| 10,212,857 B2 | 2/2019 | Eriksen |
| 10,225,958 B1 | 3/2019 | Gao |
| 10,238,010 B2 | 3/2019 | Shelnutt et al. |
| 10,271,456 B2 | 4/2019 | Tufty et al. |
| 10,321,609 B2 | 6/2019 | Hirai et al. |
| 10,331,144 B2 | 6/2019 | Shelnutt et al. |
| 10,399,190 B2 | 9/2019 | North et al. |
| 10,542,635 B2 | 1/2020 | Nishiyama |
| 10,598,441 B2 | 3/2020 | Kawabata et al. |
| 10,617,042 B2 | 4/2020 | Shelnutt et al. |
| 10,622,283 B2 | 4/2020 | Leobandung |
| 10,624,236 B2 | 4/2020 | Inano et al. |
| 10,624,242 B2 | 4/2020 | Best |
| 10,638,641 B2 | 4/2020 | Franz et al. |
| 10,645,841 B1 | 5/2020 | Mao et al. |
| 10,653,036 B1 | 5/2020 | Gao |
| 10,667,434 B1 | 5/2020 | Mao et al. |
| 10,674,641 B2 | 6/2020 | Shepard et al. |
| 10,716,238 B2 | 7/2020 | Brink |
| 10,729,039 B2 | 7/2020 | Shelnutt et al. |
| 10,791,647 B1 | 9/2020 | Miyamura et al. |
| 10,809,011 B2 | 10/2020 | Chu et al. |
| 10,871,807 B2 | 12/2020 | Best et al. |
| 10,888,032 B2 | 1/2021 | Wakino et al. |
| 10,917,998 B2 | 2/2021 | Shelnutt et al. |
| 10,932,390 B2 | 2/2021 | Korikawa |
| 10,939,580 B2 | 3/2021 | Gao |
| 10,939,581 B1 | 3/2021 | Chen et al. |
| 10,990,144 B2 | 4/2021 | Wang et al. |
| 11,006,547 B2 | 5/2021 | Gao |
| 11,032,939 B2 | 6/2021 | Tufty et al. |
| 11,071,238 B2 | 7/2021 | Edmunds et al. |
| 11,107,749 B2 | 8/2021 | Taniguchi et al. |
| 11,268,739 B2 | 3/2022 | Wang et al. |
| 11,572,614 B2 | 2/2023 | Sakamoto et al. |
| 11,751,359 B2 | 9/2023 | Heydari |
| 11,822,398 B2 | 11/2023 | Heydari |
| 2002/0159233 A1 | 10/2002 | Patel et al. |
| 2004/0244947 A1 | 12/2004 | Chen |
| 2005/0150637 A1 | 7/2005 | Tan et al. |
| 2005/0248922 A1 | 11/2005 | Chu et al. |
| 2007/0227756 A1 | 10/2007 | Doerr et al. |
| 2009/0146294 A1 | 6/2009 | Hillman et al. |
| 2009/0205590 A1* | 8/2009 | Vetrovec ............... F28F 1/40 123/41.14 |
| 2009/0260777 A1 | 10/2009 | Attlesey et al. |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St. Rock et al. |
| 2012/0058588 A1 | 3/2012 | Mayer et al. |
| 2012/0075797 A1 | 3/2012 | Attlesey |
| 2012/0120599 A1 | 5/2012 | Chua et al. |
| 2012/0193068 A1 | 8/2012 | Nemesh et al. |
| 2013/0105120 A1 | 5/2013 | Campbell et al. |
| 2014/0123492 A1 | 5/2014 | Campbell et al. |
| 2014/0216688 A1 | 8/2014 | Shelnutt et al. |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | St. Rock et al. |
| 2016/0021793 A1 | 1/2016 | Chen |
| 2016/0120059 A1 | 4/2016 | Shedd et al. |
| 2016/0305565 A1 | 10/2016 | Miller et al. |
| 2016/0330874 A1 | 11/2016 | Sato et al. |

(56) References Cited

U.S. PATENT DOCUMENTS

| | | |
|---|---|---|
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1 | 5/2017 | Campbell et al. |
| 2017/0181328 A1* | 6/2017 | Shelnutt .................... G06F 1/20 |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | We et al. |
| 2019/0014685 A1* | 1/2019 | So ...................... H05K 7/20236 |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1* | 9/2019 | Wakino ................ H01L 23/427 |
| 2020/0025451 A1 | 1/2020 | Stone et al. |
| 2020/0093037 A1 | 3/2020 | Enright et al. |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1* | 12/2021 | Manousakis ....... H05K 7/20809 |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020223806 A1 | 11/2020 |
| WO | 2020234600 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.

"IBM's Hot-Water Supercomputer Goes Live", Data Center Knowledge, retrieved on Jul. 19, 2021, 9 pages.

Extended European Search Report with regard to the EP Patent Application No. 21306771.3 completed May 23, 2022.

Extended European Search Report with regard to the EP Patent Application No. 21306173.2 completed Feb. 18, 2022.

Extended European Search Report with regard to the EP Patent Application No. 21306174.0 completed Feb. 14, 2022.

Extended European Search Report with regard to the EP Patent Application No. 21306172.4 completed Feb. 15, 2022.

English Abstract for JP2020065002 retrieved on Espacenet on Jun. 2, 2022.

Extended European Search Report with regard to the EP Patent Application No. 21306186.4 completed Feb. 10, 2022.

Extended European Search Report with regard to the EP Patent Application No. 21306187.2 completed Feb. 10, 2022.

Extended European Search Report with regard to the EP Patent Application No. 21306175.7 completed Apr. 8, 2022.

Extended European Search Report with regard to the EP Patent Application No. 21306188.0 completed Feb. 10, 2022.

English Abstract for JPH043451 retrieved on Feb. 22, 2022.

Extended European Search Report with regard to the EP Patent Application No. 21306171.6 completed Feb. 11, 2022.

Extended European Search Report with regard to the EP Patent Application No. 21306189.8 completed Feb. 10, 2022.

Extended European Search Report with regard to the EP Patent Application No. 21306170.8 completed Feb. 12, 2022.

English Abstract for NL1006486 retrieved on Espacenet on Jun. 3, 2022.

International Search Report and Written Opinion with regard to PCTIB2022053071 mailed Jun. 28, 2022.

International Search Report and Written Opinion with regard to PCT/IB2022/052975 mailed Jun. 20, 2022.

International Search Report and Written Opinion with regard to PCTIB2022052330 mailed May 30, 2022.

International Search Report and Written Opinion with regard to PCT/IB2022/052976 mailed Jun. 17, 2022.

International Search Report and Written Opinion with regard to PCT/IB2022/052977 mailed Jun. 20, 2022.

European Search Report with regard to EP21306170.8 completed Feb. 12, 2022.

European Search Report with regard to EP21306189.8 completed Feb. 10, 2022.

(56) References Cited

OTHER PUBLICATIONS

Notice of Allowance with regard to the counterpart U.S. Appl. No. 17/691,494 mailed Apr. 17, 2023.
Office Action with regard to the counterpart U.S. Appl. No. 17/698,480 mailed Sep. 7, 2023.
Office Action with regard to the counterpart U.S. Appl. No. 17/697,452 mailed May 11, 2023.
Office Action with regard to the counterpart U.S. Appl. No. 17/697,452 mailed Nov. 22, 2023.
Office Action with regard to te counterpart U.S. Appl. No. 17/690,839 issued Jun. 25, 2024.
Office Action with regard to the counterpart U.S. Appl. No. 17/694,765 mailed Dec. 21, 2023.
Extended European Search Report with regard to the counterpart EP Patent Application No. 22305018.8 completed Jun. 24, 2022.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Office Action with regard to te counterpart CN Patent Application No. 2022103375051 issued May 11, 2024.
Office Action with regard to the counterpart U.S. Appl. No. 17/698,037 mailed Feb. 26, 2024.
Office Action with regard to the counterpart U.S. Appl. No. 17/697,616 mailed Feb. 26, 2024.
Notice of Allowance with regard to the counterpart U.S. Appl. No. 17/690,839 mailed Mar. 5, 2024.
Office Action with regard to te counterpart U.S. Appl. No. 17/698,480 issued Jul. 3, 2024.
Notice of Allowance with regard to te counterpart U.S. Appl. No. 17/697,616 issued Jul. 23, 2024.
Notice of Allowance with regard to the counterpart U.S. Appl. No. 17/707,200 issued Aug. 15, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.
Office Action with regard to the counterpart U.S. Appl. No. 17/697,452 issued Sep. 6, 2024.
Office Action with regard to the counterpart CN Patent Application No. 2022103478109 issued Aug. 30, 2024.

* cited by examiner

SYSTEMS AND METHODS FOR AUTONOMOUSLY ACTIVABLE REDUNDANT COOLING OF A HEAT GENERATING COMPONENT

CROSS-REFERENCE

The present patent application claims priority from European Patent Application Number 21305427.3, filed on Apr. 1, 2021, and from European Patent Application No. 21306173.2 filed on Aug. 30, 2021, the entirety of each of which is incorporated by reference herein.

FIELD

The present technology relates to cooling techniques for electronic equipment. In particular, a cooling system and a method for autonomously activable redundant cooling of a heat generating component are disclosed.

BACKGROUND

Heat dissipation is an important consideration for computer systems. Notably, many components of a computer system, such as a processor (for example a central processing unit (CPU), a graphical processing unit (GPU), and the like), generate heat and thus require cooling to avoid performance degradation and, in some cases, failure. Similar considerations arise for systems other than computer systems (e.g., power management systems). Different types of cooling systems are therefore implemented to promote heat dissipation from heat-generating components, with the objective being to efficiently collect and conduct thermal energy away from heat-generating components.

Heat sinks rely on a heat transfer medium (e.g., a gas or liquid) to carry away the heat generated by a heat generating component. For example, a water block, which is a water cooling heat sink, is thermally coupled to the component to be cooled (e.g., a processor) and water, or other heat transfer fluid, is made to flow through a conduit in the water block to absorb heat from the heat generating component. As water flows out of the water block, so does the thermal energy collected thereby. As another example, immersion cooling systems have been gaining popularity whereby the heat generating component is immersed in a dielectric coolant or other immersion heat transfer fluid.

Said solutions typically rely on pumping systems to provide a flow of the heat transfer fluid, such that thermal energy may be carried away from the heat generating component. However, such solutions involving liquid and/or fluid for transferring heat are sometimes susceptible to leaks, obstructions in their cooling loop that disable a flow of the heat transfer fluid, or any other failures which can decrease their efficiency and, as such, cause the temperature of the heat generating component to increase.

There is therefore a desire for redundant cooling solutions that may be activated, or "triggered", before overheating of the heat generating component, in order to prevent overheating and any other damages of the heat generating component.

SUMMARY

Embodiments of the present technology have been developed based on developers' appreciation of shortcomings associated with the prior art.

In one aspect, various implementations of the present technology provide a cooling system for cooling a heat generating component, the cooling system comprising a main cooling arrangement thermally coupled to the heat generating component, and configured for collecting thermal energy of the heat generating component via a main heat transfer fluid; and a backup cooling arrangement thermally coupled to the main cooling arrangement, the backup cooling arrangement comprising at least one fluid path configured for conducting a backup heat transfer fluid; a thermal fuse disposed within at least a portion of the at least one fluid path, the thermal fuse changing from a solid state to a melted state and selectively enabling a flow of the backup heat transfer fluid in the at least one fluid path of the backup cooling arrangement in response to its temperature being above a temperature threshold, the backup heat transfer fluid being configured to, upon flowing in the at least one fluid path, collect thermal energy from the main cooling arrangement.

In some embodiments of the present technology, the at least one fluid path of the backup cooling arrangement comprises a backup cooling loop, the thermal fuse being disposed within the backup cooling loop, the backup cooling loop comprising a backup liquid cooling block having a backup internal fluid conduit, the backup liquid cooling block being thermally coupled to the main cooling arrangement; and a backup pump fluidly connected to the backup internal fluid conduit, the backup pump being configured for causing the backup heat transfer fluid to flow within the backup cooling loop.

In some embodiments of the present technology, the thermal fuse is disposed within the backup internal fluid conduit, the thermal fuse being configured to inhibit the flow of the backup heat transfer fluid within the backup internal fluid conduit in response to an initial temperature of the thermal fuse being below the temperature threshold upon being disposed within the backup internal fluid conduit.

In some embodiments of the present technology, the thermal fuse is disposed at an inlet of the backup internal fluid conduit, the thermal fuse being configured to inhibit the flow of the backup heat transfer fluid within the backup internal fluid conduit in response to an initial temperature of the thermal fuse being below the temperature threshold upon being disposed within the backup internal fluid conduit.

In some embodiments of the present technology, the main cooling arrangement comprises a main cooling loop comprising a main liquid cooling block having a main internal fluid conduit, the main liquid cooling block being thermally coupled to the heat generating component such that, in use, thermal energy of the heat generating component is collected by the main heat transfer fluid flowing in the main internal fluid conduit; and a main pump fluidly connected to the main internal fluid conduit, the main pump being configured for causing the main heat transfer fluid to flow within the main cooling loop.

In some embodiments of the present technology, the cooling system further comprises a tank filled with a dielectric heat transfer fluid for immersive cooling of the heat generating component, the heat generating component being disposed within the tank such that thermal energy generated therefrom is collected by the dielectric heat transfer fluid; and an immersive cooling pump configured for causing the dielectric heat transfer fluid to flow within the tank, wherein the backup heat transfer fluid flowing in the at least one fluid path is extracted from the tank by the backup pump.

In some embodiments of the present technology, the backup cooling loop is an open cooling loop fluidly connected to the tank.

In some embodiments of the present technology, the main cooling arrangement comprises a tank filled with a dielectric heat transfer fluid for immersive cooling of the heat generating component, the heat generating component being disposed within the tank such that thermal energy generated therefrom is collected by the dielectric heat transfer fluid; and an immersive cooling pump configured for causing the dielectric heat transfer fluid to flow within the tank.

In some embodiments of the present technology, the main and backup heat transfer fluid are a same dielectric heat transfer fluid, and the main cooling arrangement comprises a tank filled with the dielectric heat transfer fluid for immersive cooling of the heat generating component, the heat generating component being disposed within the tank such that thermal energy generated therefrom is collected by the dielectric heat transfer fluid; and an immersive cooling pump configured for causing the dielectric heat transfer fluid to flow within the tank, the at least one fluid path of the backup cooling arrangement being immersed within the tank and being fluidly connected therewith, the backup cooling arrangement further comprising a pump configured for causing the dielectric heat transfer fluid to flow within the at least one fluid path.

In some embodiments of the present technology, the thermal fuse comprises a phase change material.

In some embodiments of the present technology, the phase change material comprises paraffin wax.

In some embodiments of the present technology, the backup cooling arrangement further comprises a temperature sensor configured for sensing a temperature of the backup heat transfer fluid in the at least one fluid path, the temperature sensor being communicably connected to a controller.

In some embodiments of the present technology, the temperature sensor is configured for providing to the controller a signal indicative of a temperature flow of the backup heat transfer fluid in the at least one fluid path for controlling the backup pump.

In some embodiments of the present technology, the temperature threshold is a melting temperature of the phase change material.

In some embodiments of the present technology, the thermal fuse is dissolved in the backup heat transfer fluid in response to its temperature being higher than the temperature threshold In the context of the present specification, unless expressly provided otherwise, electronic equipment may refer, but is not limited to, "servers", "electronic devices", "operation systems", "systems", "computer-based systems", "controller units", "monitoring devices", a "control devices" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
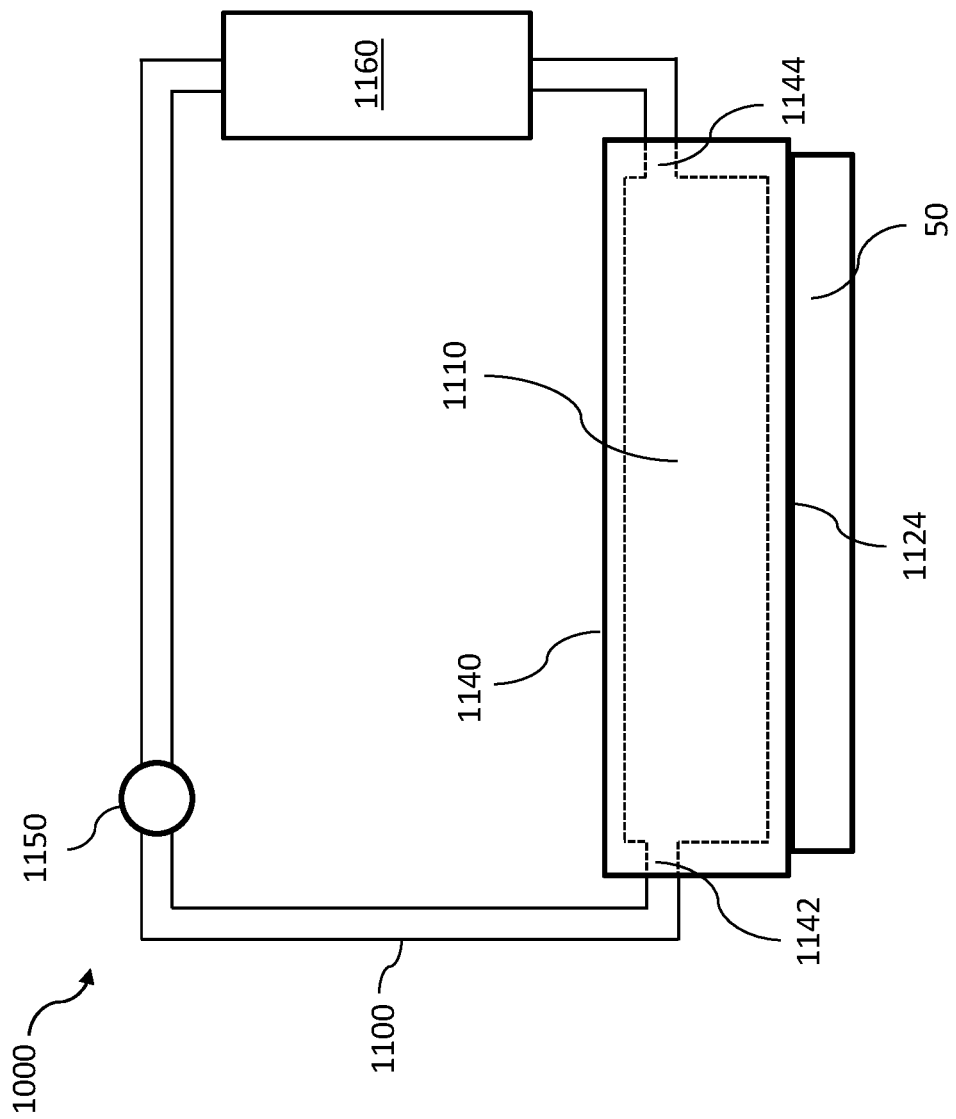
FIG. 1 is a schematic diagram of a cooling arrangement comprising a liquid cooling block installed on a heat generating component to be cooled.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various systems that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

An aspect of the present technology introduces a cooling system and a method for cooling of a heat generating component, for example a processor, with autonomously activable redundancy. In one embodiment, the cooling system comprises a main cooling arrangement thermally coupled to the heat generating component for cooling thereof. As it will be described in greater details hereinafter, the main cooling arrangement may comprise a liquid cooling block (also called "water block", "cold plate", or "thermal transfer device"), may be an immersive cooling arrangement, or any other cooling arrangement for providing suitable for cooling the heat generating component. The cooling system also comprises a backup cooling arrangement that provide redundancy to the main cooling arrangement. In this embodiment, the backup cooling arrangement is thermally coupled to the main cooling arrangement and comprises a thermal fuse. The thermal fuse is disposed such that it disables the operation of the backup cooling arrangement when a temperature of the thermal fuse is below a temperature threshold, and enables it in response to its temperature being above the temperature threshold.

In other words, the backup cooling arrangement may collect thermal energy of the main cooling arrangement, thereby providing cooling to the heat generating component, in response to the thermal energy generated by the heat generating component exceeding an amount of thermal energy that may be properly collected by the main cooling arrangement. For example, when a failure of the main cooling arrangement arises, thermal energy of the heat generating component is not properly collected and carried away by the main cooling arrangement. The temperature of the cooling system thus increases from a low initial temperature, and a state of the thermal fuse changes from a solid state to a melted state in response to its temperature exceeds a temperature threshold (e.g. a melting temperature of the thermal fuse), thereby enabling an operation of the backup cooling arrangement to provide cooling to the heat generating component. In this embodiment, once the thermal fuse has melted, the state of the thermal fuse stays in the melted state in response to the temperature of the thermal fuse being below the temperature threshold.

In one embodiment, the backup cooling arrangement comprises a liquid cooling block having an internal fluid path for conducting a backup heat transfer fluid configured for collecting thermal energy of the main cooling arrangement. The thermal fuse is disposed within the internal fluid path, initially being in a solid state to disable a flow of the backup heat transfer fluid within the liquid cooling block given that the thermal fuse and the internal fluid are at an initial temperature below the temperature threshold upon being disposed within the internal fluid path. When a failure of the first cooling system arises, for example a clogging of a liquid cooling block of the main cooling arrangement, the thermal energy causes the thermal fuse to change from the solid state to a melted state, thereby enabling the flow of the backup heat transfer fluid in the backup cooling arrangement. Thermal energy is thus collected and carried away by the backup cooling arrangement when a failure of the first cooling system arises. As described hereafter, other types of main and backup cooling arrangements are contemplated in alternative embodiments.

With these fundamentals in place, we will now consider some non-limiting examples to illustrate various implementations of aspects of the present technology.

FIG. 1 is a schematic diagram of a cooling arrangement 1000 comprising a liquid cooling block 1140 installed on a heat generating component 50 to be cooled. For example, the heat generating component 50 may be a processor of a computer system and may be mounted to a mother board thereof. The computer system may be, for example and without limitation, a server of a datacentre disposed in a rack thereof. FIG. 1 is not to scale; while perimeters of the liquid cooling block 1140 and of the heat generating component 50 may be similar, their relative sizes are for illustration purposes only.

In this illustrative example, the cooling arrangement 1000 comprises a cooling loop 1100 comprising the liquid cooling block 1140 thermally coupled to the heat generating component 50. The liquid cooling block 1140 is a heat sink that uses a heat transfer fluid (e.g. water or another liquid) for transferring thermal energy. In some instances, the liquid cooling block 1140 may be a water block and the heat transfer fluid may comprise water. It is to be understood that the term "liquid cooling block" is intended to include such thermal transfer devices that use water, or any fluids other than water and/or multiphase flow (e.g., two-phase flow). For example, in some instance, the fluid may be an oil, an alcohol, or a dielectric heat transfer fluid (e.g., 3M Novec®).

The liquid cooling block 1140 is configured to receive the heat transfer fluid that is circulated through a fluid path formed by the cooling loop 1100 and an internal conduit 1110 in the liquid cooling block 1140. Circulation of the heat transfer fluid in the internal conduit 1110 allows to absorb the thermal energy from the heat generating component 50. The liquid cooling block 1140 defines a fluid inlet 1142 and a fluid outlet 1144 for respectively feeding and discharging the heat transfer fluid from the internal fluid conduit 1110. As the heat transfer fluid flows out of the liquid cooling block 1140, so does the thermal energy absorbed thereby.

The liquid cooling block 1140 has an external thermal transfer surface 1124 configured to be in thermal contact with the heat-generating component 50. It is to be understood that in this context, the external thermal transfer surface 1124 is said to be "in thermal contact" with the heat-generating component 50 whether the liquid cooling block 1140 is in direct contact with the heat-generating component 50 or when a thermal paste is applied between the external thermal transfer surface 1124 and the heat-generating component 50, in a manner that is known in the art, to ensure adequate heat transfer between the heat-generating component 50 and the external thermal transfer surface 1124.

The cooling loop 110 further comprises a cooling apparatus 1160 (e.g. a heat exchanger) configured for receiving the heated heat transfer fluid from the liquid cooling block 1140. As such, the heated heat transfer fluid discharged from the liquid cooling block 1140 is cooled in the cooling apparatus 1160 before returning to the liquid cooling block 1140. The cooling apparatus 1160 through which the heat transfer fluid is cooled between the fluid outlet 1144 and the fluid inlet 1142 may be of various constructions, being for example an air-to-liquid heat exchanger or a liquid-to-liquid heat exchanger, and will not be described herein.

The cooling loop 1100 also comprises a pump 1150 to pump the heat transfer fluid into and out of the internal conduit 1110 of the liquid cooling block 1140.

Figure 2:
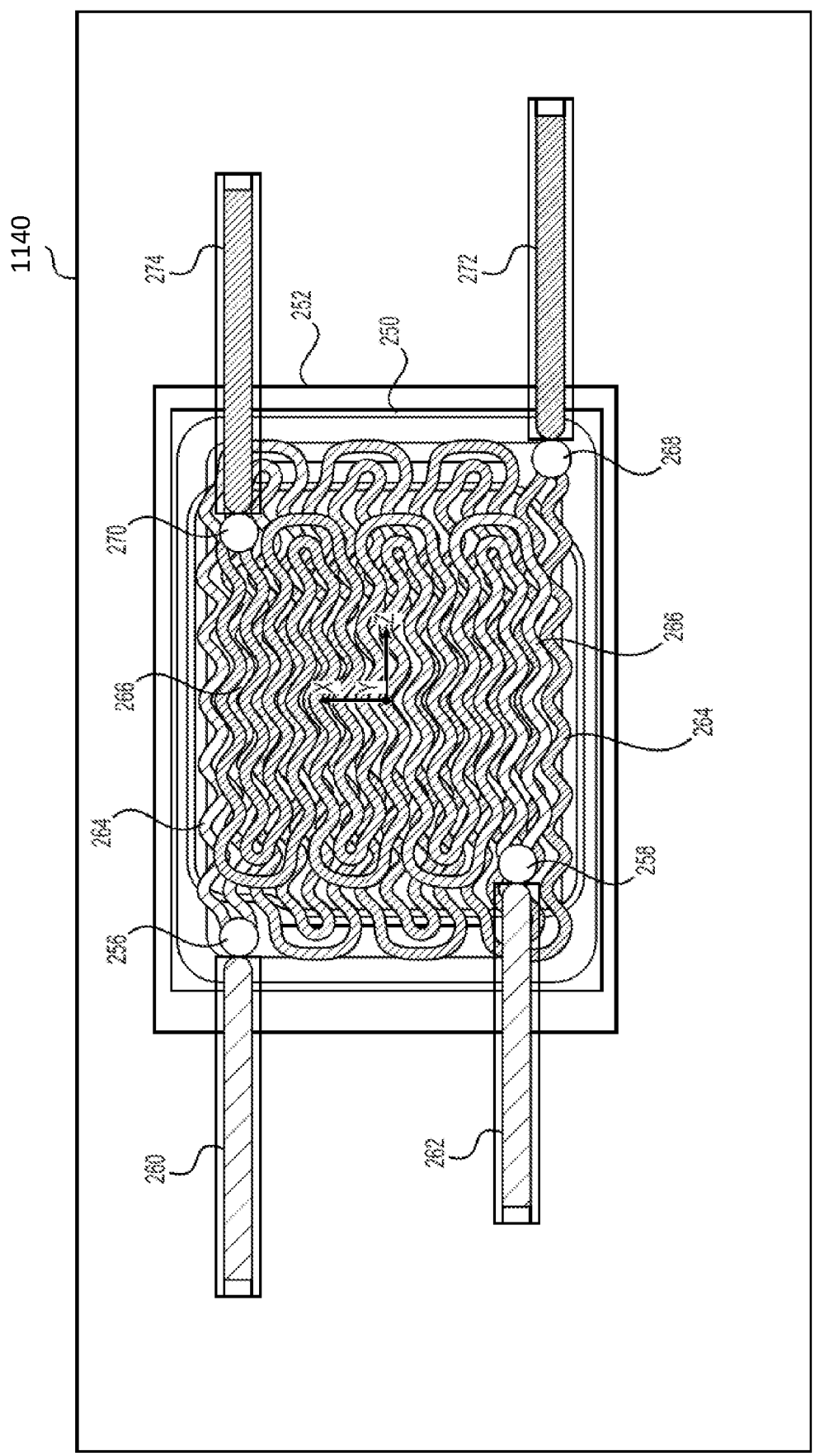
FIG. 2 is a top plan schematic representation of a liquid cooling block of the cooling arrangement of FIG. 1.

FIG. 2 is atop plan schematic representation of the liquid cooling block 1140 mounted on the heat generating component 50. In this illustrative example, the liquid cooling block 1140 may for example comprise two redundant liquid inlets 256 and 258 respectively connectable to redundant conduits 260 and 262 (only their ends are shown) for receiving the heat transfer fluid. The heat transfer fluid may thus flow through redundant liquid channels 264 and 266 that zigzag within the liquid cooling block 1140 to maximize the heat absorption potential of the heat transfer fluid across a surface of the liquid cooling block 1140. The liquid channels 264 and 266 terminate at two redundant liquid outlets 268 and 270 that are respectively connectable to redundant conduits 272 and 274 (only their ends are shown) for hot heat transfer fluid output.

Other shapes of the liquid cooling block 1140 and/or shapes of its conduits are contemplated in alternative embodiments. For example, the liquid cooling block 1140 may comprise a single internal conduit defining a spiral shape.

Broadly speaking, an aspect of the present technology is to introduce a cooling system with autonomously activable redundancy. As such, the cooling system comprises at least a main and a backup cooling arrangements, the backup cooling arrangement being thermally coupled to the main cooling arrangement for redundancy and comprising a thermal fuse. The thermal fuse is disposed such that it disables the operation of the backup cooling arrangement when a temperature of the thermal fuse is below a temperature threshold. More specifically, the thermal fuse opposes the flow of a backup heat transfer fluid within the backup cooling arrangement when a temperature of the backup heat transfer fluid and/or the thermal fuse is lower than the melting temperature of the thermal fuse.

Figure 3:
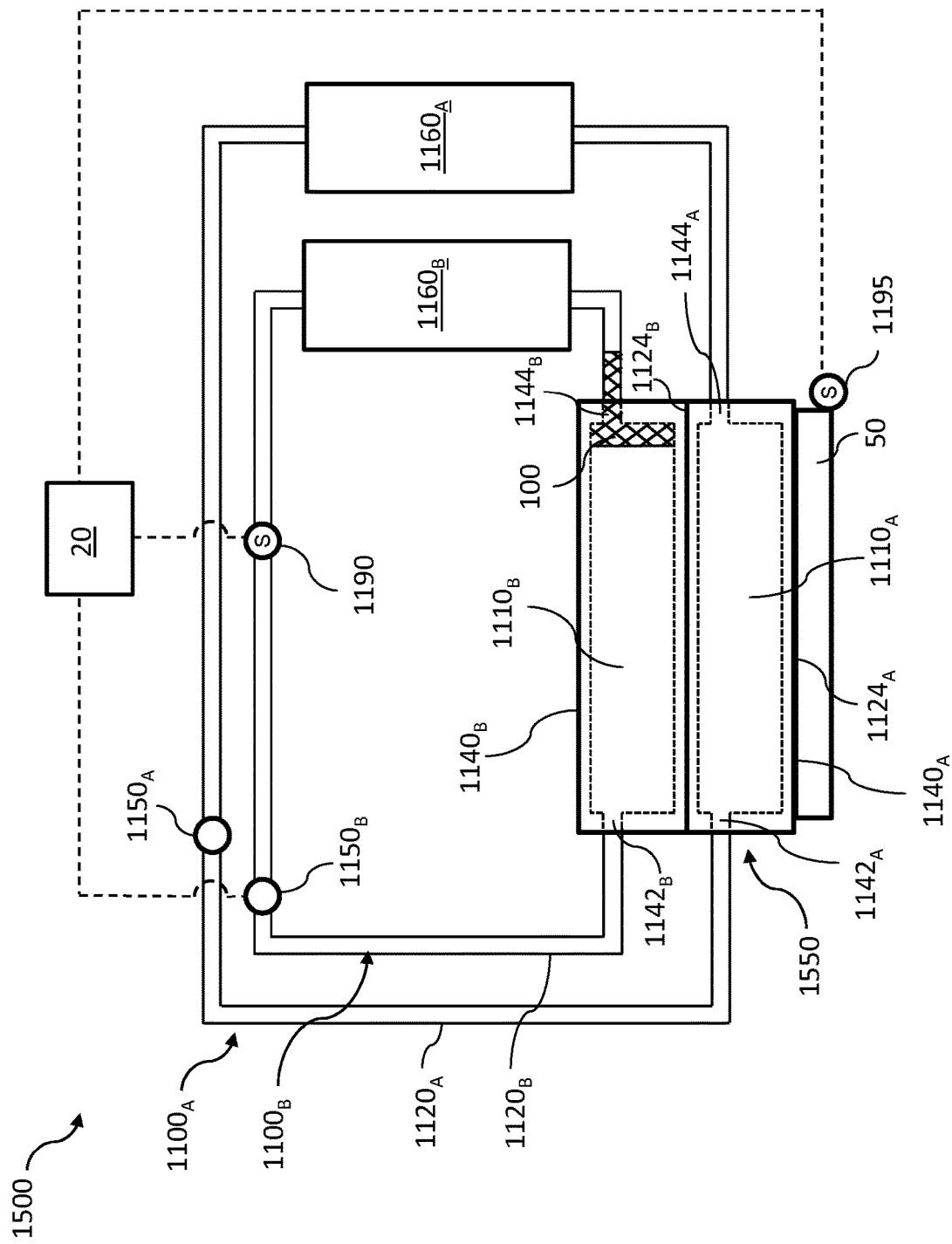
FIG. 3 is a schematic diagram of a cooling system comprising a main cooling arrangement and a backup cooling arrangement in accordance with an embodiment of the present technology.

FIG. 3 is a schematic diagram of a cooling system 1500 comprising a main cooling arrangement $1100_A$ and a backup cooling arrangement $1100_B$, each of the main and backup cooling arrangements $1100_A$, $1100_B$ being similar to the cooling loop 1100 described on FIG. 1. More specifically, the main cooling arrangement $1100_A$ is formed of a main cooling loop $1120_A$ comprising a main liquid cooling block $1140_A$, a main pump $1150_A$ and a main cooling apparatus $1160_A$, a main heat transfer fluid flowing in the main cooling loop $1120_A$. As previously described with respect to the liquid cooling block 1140, the main liquid cooling block $1140_A$ defines an external thermal transfer surface $1124_A$ configured to be in contact with the heat-generating component 50, such that, in use, thermal energy thereof may be collected by the main heat transfer fluid flowing in an internal fluid conduit $1110_A$ extending between a fluid inlet $1142_A$ and a fluid outlet $1144_A$ of the main liquid cooling block $1140_A$.

Similarly, the backup cooling arrangement $1100_B$ forms a fluid path comprising a backup cooling loop $1120_B$ including a backup liquid cooling block $1140_B$, a backup pump $1150_B$ and a backup cooling apparatus $1160_B$, a backup heat transfer fluid flowing in the backup cooling loop $1120_B$ upon activation of the backup cooling arrangement $1100_B$. Activation of the backup cooling arrangement $1100_B$ is described in greater details hereafter. As previously described with respect to the liquid cooling block 1140, the backup liquid cooling block $1140_B$ defines an external thermal transfer surface $1124_B$ configured to be in thermal contact with an upper surface of the main liquid cooling block $1140_A$, the upper surface being opposed to the external thermal transfer surface $1124_A$. Mounting the backup liquid cooling block $1140_B$ on a surface of the heat-generating component 50 opposite from a mounting surface of the main liquid cooling block $1140_A$ is also contemplated. In use, thermal energy generated by the heat-generating component 50 may be collected by the backup heat transfer fluid flowing in an internal fluid conduit 1110E extending between a fluid inlet $1142_B$ and a fluid outlet 1144E of the backup liquid cooling block $1140_B$. The main and backup heat transfer fluids may be the same or different types of fluids (e.g. the main heat transfer fluid may be demineralized water and the backup heat transfer fluid may be a refrigerant).

As such, the main and backup liquid cooling blocks $1140_A$, $1140_B$ define a liquid cooling block assembly 1550. More specifically, the liquid cooling block assembly 1550 comprises the main liquid cooling block $1140_A$, also referred to as the "lower" liquid cooling block $1140_A$, and the backup liquid cooling block $1140_B$, also referred to as the "upper" liquid cooling block $1140_B$ stacked on the lower liquid cooling block $1140_A$ such that, in use, the lower liquid cooling block $1140_A$ is disposed between the upper liquid cooling block $1140_B$ and the heat generating component 50. As will be described in greater detail below, the lower and upper liquid cooling block $1140_A$, $1140_B$ can, in some cases, provide the liquid cooling block assembly 1550 with redundancy such that if the lower liquid cooling block $1140_A$ were to experience a decrease in performance (e.g., due to a blockage in the fluid path at a level of the main cooling loop $1120_A$ or within the internal fluid conduit $1110_A$), the upper liquid cooling block $1140_B$ would continue cooling the target component 50.

In this embodiment, the backup cooling arrangement $1100_B$ comprises a thermal fuse 100 initially disposed within at least a portion of the backup cooling loop $1120_B$. The thermal fuse is configured for changing from a solid state to a melted state in response to its temperature being above a given temperature threshold (i.e. a "melting temperature" of the thermal fuse 100). As such, a flow of the backup heat transfer fluid in the backup cooling loop $1120_B$ is initially blocked due to the presence of the thermal fuse 100 disposed in its solid state.

The thermal fuse 100 is made of a material having a melting temperature higher than a normal operating temperature of the main heat transfer fluid and lower than a maximum safe operating temperature of the heat generating component 50. In normal operation of the cooling system 1500, the temperature of the backup heat transfer fluid is lower than the melting temperature of the thermal fuse 100. The thermal fuse 100 opposes the flow of the backup heat transfer fluid within the cooling loop of the backup cooling arrangement $1100_B$ under such condition.

In this embodiment, the backup cooling arrangement $1100_B$ comprises a controller 20 and a temperature sensor 1195 for sensing a temperature of the heat generating component 50, the temperature sensor 1195 being communicably connected to the controller 20. The backup pump 1150E is communicably connected to the controller 20 such that the controller 20 may, in response to the temperature sensor 1195 sensing that a temperature of the heat generating component 50 is above a heat generating component temperature threshold (e.g. set according to the melting temperature of the thermal fuse 100), actuate the backup pump $1150_B$.

In response to the temperature of the thermal fuse being above the temperature threshold, the flow of the backup heat transfer fluid is enabled, thereby providing additional cooling to the heat generating component 50 by the backup cooling arrangement $1100_B$.

More specifically, in the event of a failure of the main cooling arrangement $1100_A$ or abnormal operation thereof (e.g. clogging of the main cooling loop $1120_A$), the main heat transfer fluid may be unable to suitably collect thermal energy expelled by the heat generating component 50. For example, if a flow rate of the main heat transfer fluid decreases, the main heat transfer fluid may not carry thermal energy in a suitable manner so as to ensure proper cooling of the heat generating component 50. As such, a temperature of the main heat transfer fluid and/or of the main liquid cooling block $1140_A$ may rise. Given that the backup liquid cooling block $1140_B$ is thermally coupled to the main liquid cooling block $1140_A$, and/or to the heat generating component 50, the temperature of the backup liquid cooling block $1140_B$ may similarly rise until a temperature of the thermal fuse 100 reaches the given temperature threshold, resulting in the melting of the thermal fuse 100 and dispersion of its melted material in the backup heat transfer fluid. As such, the backup cooling arrangement $1100_B$ provides redundant cooling and may be autonomously activated in response to a rise of the temperature of the main heat transfer fluid. In this embodiment, the thermal fuse 100 is dissolved in the backup heat transfer fluid in response to its temperature being higher than the temperature threshold, thus enabling a flow of the backup heat transfer fluid in the backup cooling loop $1120_B$.

It may be noted that, once melted, the thermal fuse 100 no longer exists and is dispersed and/or dissolved within the backup heat transfer fluid. If the temperature of the backup heat transfer fluid is reduced below the melting temperature of the thermal fuse 100, pieces of the material of the thermal fuse 100 may be expected to solidify and be carried by the backup heat transfer fluid.

As illustrated, the thermal fuse 100 may be disposed proximally to the outlet 1144B of the backup liquid cooling block $1140_B$ and/or within the internal fluid conduit $1110_B$ thereof on FIG. 3. Other locations for disposing the thermal fuse 100 are contemplated in alternative embodiments of the present technology such as the inlet $1142_B$ of the backup liquid cooling block $11140_B$. As an example and without limitation, the thermal fuse 100 may be made a phase change material (PCM), for example paraffin wax, or any other suitable material such as wax, resin, paraffin, grease, silicone, synthetic glue and polymers.

In this embodiment, the backup cooling arrangement $1100_B$ further comprises a flow rate sensor 1190 sensing a flow of the backup heat transfer fluid in the backup cooling loop $1120_B$. The controller 20 may be communicably connected to the flow rate sensor 190 and may receive data therefrom. In this embodiment, the flow rate sensor 190 may provide a visual information and/or transmit a signal to the controller 20 in response to the flow rate of the backup heat transfer fluid is non-null. As such, an operator of the cooling system 1500 may be provided with the visual information that the flow rate of the backup heat transfer fluid is non-null, the visual information being indicative that a temperature of the main cooling arrangement $1100_A$ has increased and that the temperature of the thermal fuse 100 has reached the temperature threshold.

Figure 4:
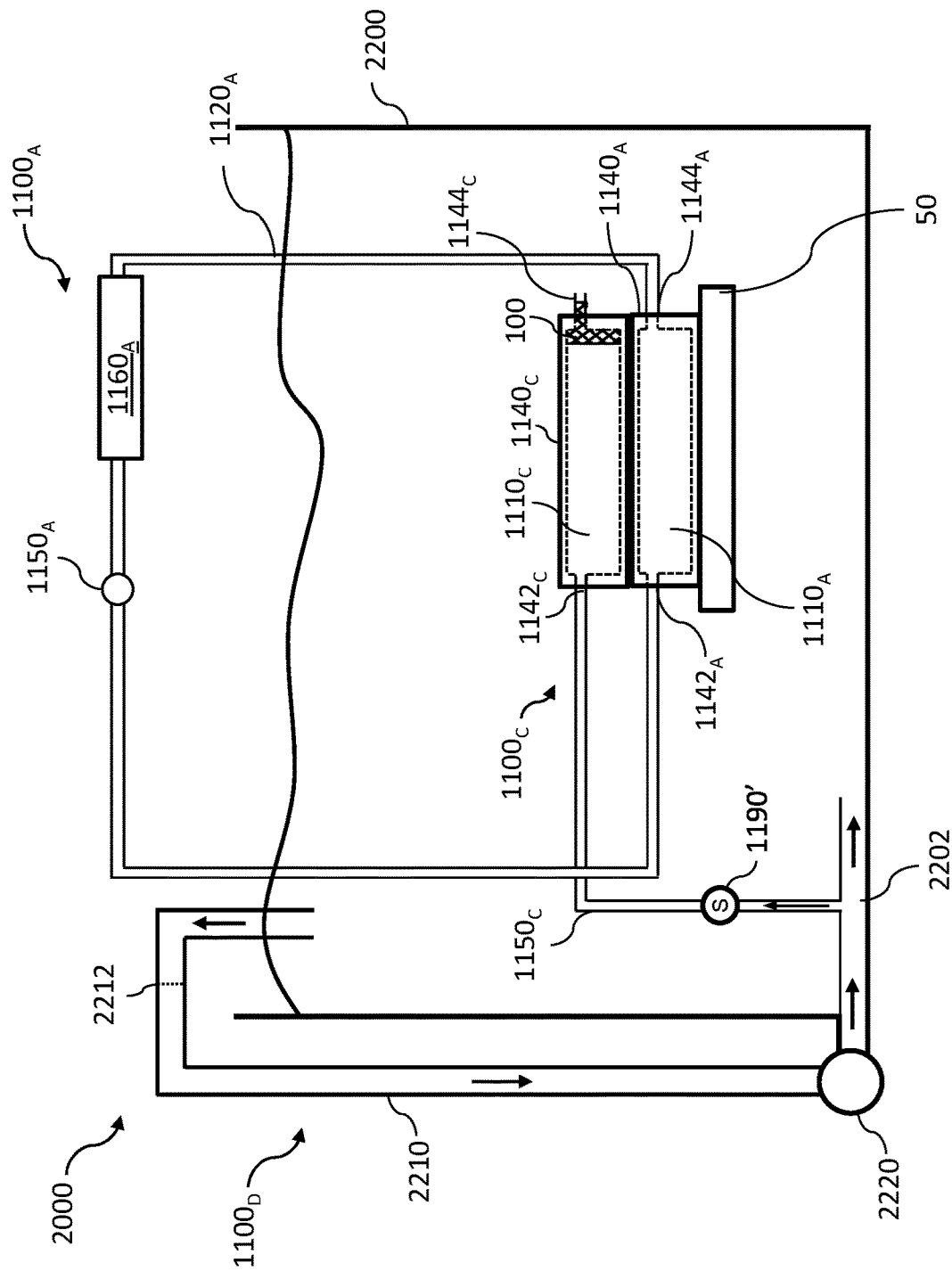
FIG. 4 is a schematic diagram of a cooling system comprising a main cooling arrangement and a backup cooling arrangement in accordance with another embodiment of the present technology.
Figure 5:
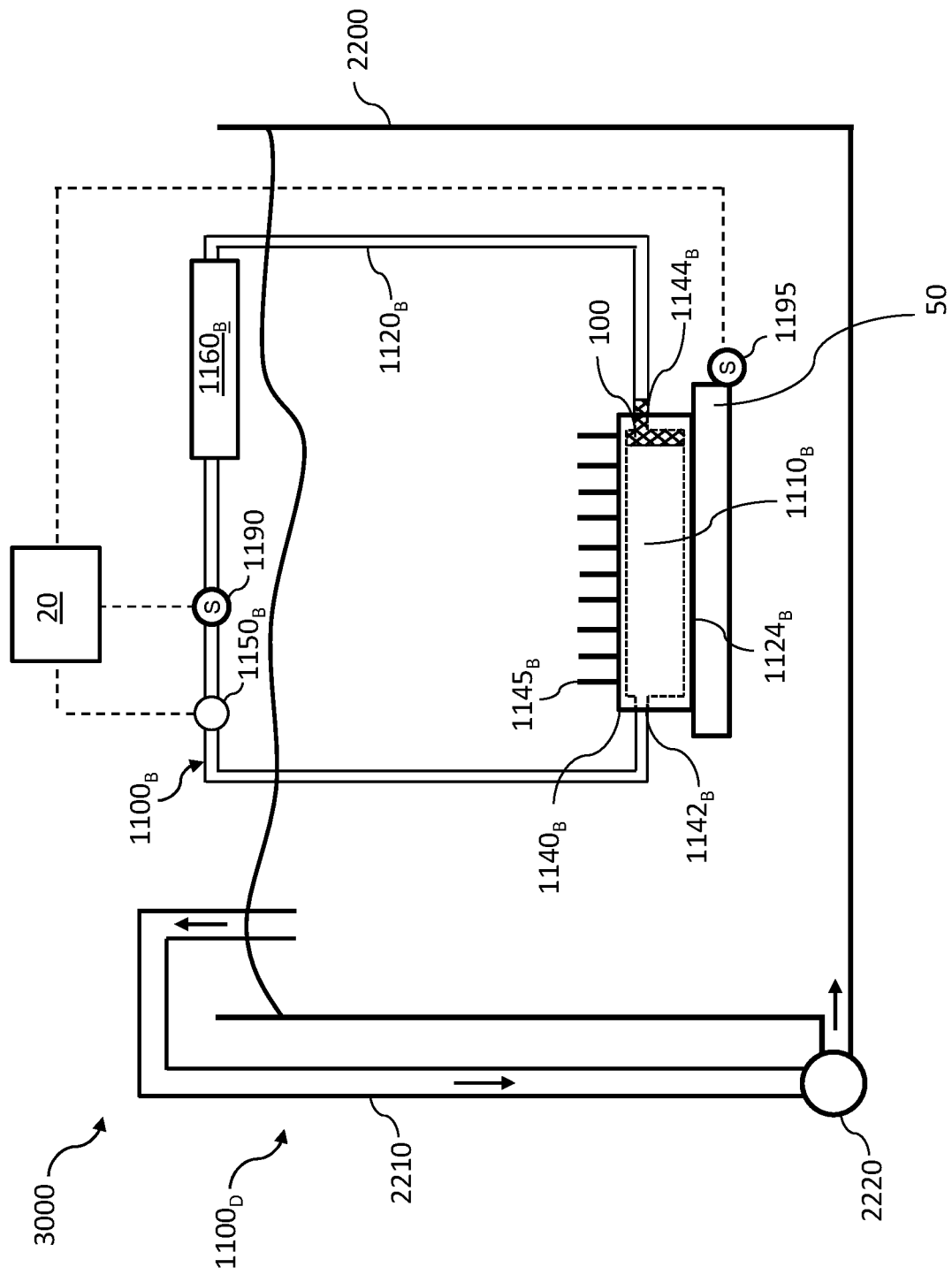
FIG. 5 is a schematic diagram of a cooling system comprising a main cooling arrangement and a backup cooling arrangement in accordance with yet another embodiment of the present technology.
Figure 6:
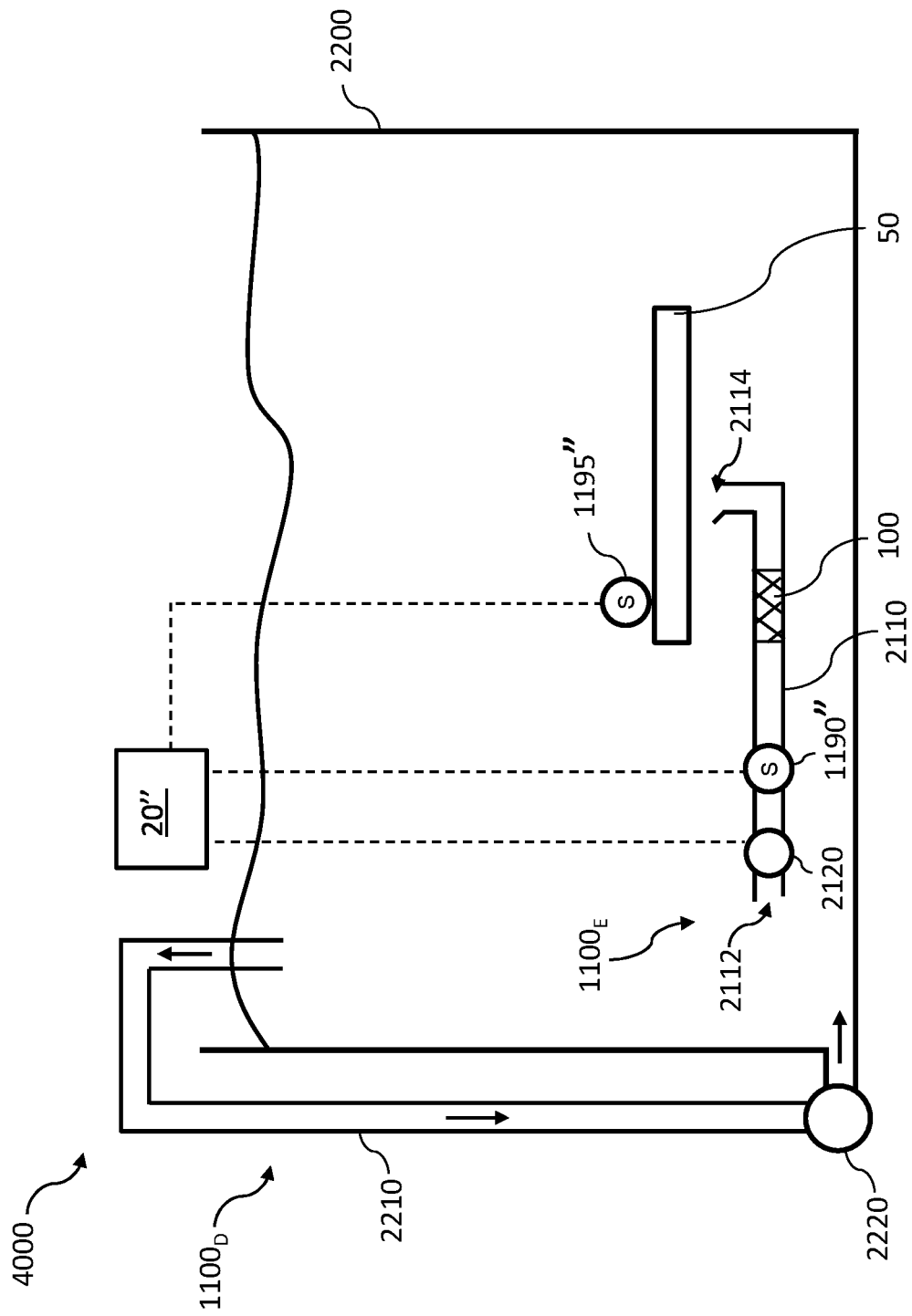
FIG. 6 is a schematic diagram of a cooling system comprising a main cooling arrangement and a backup cooling arrangement in accordance with yet another embodiment of the present technology.

FIGS. 4 to 6 depict alternative embodiments of the present technology with different types of main and backup cooling arrangements for immersive cooling of the heat generating component 50. Similarly to the backup cooling arrangement $1100_B$ described on FIG. 3, backup cooling arrangements described in FIGS. 4 to 6 hereafter are autonomously activable.

FIG. 4 is a schematic diagram of a cooling system 2000 comprising the main cooling arrangement $1100_A$, a backup cooling arrangement $1100_C$ and an immersion cooling arrangement $1100_D$.

In this embodiment, the immersion cooling arrangement $1100_D$ comprises a tank 2200 filled with a dielectric heat transfer fluid for collecting thermal energy of the heat generating component 50, the heat generating component 50 being disposed within the tank 2200. As such, the main cooling arrangement $1100_A$, including the heat generating component 50 and the main liquid cooling block $1140_A$, is at least partially immersed in the dielectric heat transfer fluid. An immersive cooling pump 2220, or simply "pump 2220", fluidly connected to the tank 2200 is configured for maintaining a flow of the dielectric heat transfer fluid within the tank. The pump 2220 may be external with respect to the tank 2200 or immersed within the tank 2200. A cooling apparatus (not shown) may be provided along the external fluid conduit 2210 to cool the dielectric heat transfer fluid. On the illustrative example of FIG. 4, the pump 2220 causes a flow of the dielectric heat transfer fluid from a surface of the tank 2200 to a bottom of the tank 2200 such that tank 2200 receives cooled dielectric heat transfer fluid at a tank inlet 2202.

In this embodiment, the backup cooling arrangement $1100_C$ comprises an open cooling loop comprising a backup liquid cooling block $1140_C$ defining an internal fluid conduit $1110_C$ extending between a fluid inlet $1142_C$ and a fluid outlet $1144_C$ of the backup liquid cooling block $1140_C$. As depicted on FIG. 4, the backup liquid cooling block $1140_C$ defines an external thermal transfer surface configured to be in contact with an upper surface of the main liquid cooling block $1140_A$ such that the backup liquid cooling block $1140_C$ is thermally coupled to the main liquid cooling block $1140_A$. In this embodiment, the backup cooling arrangement $1100_C$ comprises an immersed fluid conduit $1150_C$ extending between the tank inlet 2202 and the fluid inlet $1142_C$ such that the backup liquid cooling block $1140_C$ is fluidly connected to the tank inlet 2202. As such, the tank inlet 2202 parallelly provides cooled dielectric heat transfer fluid to the backup liquid cooling block $1140_C$ and to the tank 2200.

The thermal fuse 100 is initially disposed within the open cooling loop of the backup cooling arrangement $1100_C$. As an example, the thermal fuse 100 is disposed in its solid state at or near the fluid outlet $1144_C$ of the backup liquid cooling block $1140_C$ on FIG. 4. Other locations for disposing the thermal fuse 100 are contemplated in alternative embodiments of the present technology such as the inlet $1142_C$ of the backup liquid cooling block $1140_C$. As such, in response to the temperature of the main heat transfer fluid flowing within the main liquid cooling block $1140_A$ being above the melting temperature of the thermal fuse 100, the state of the thermal fuse 100 change from the solid state to the melted state, thereby enabling a flow of the dielectric heat transfer fluid within the internal fluid conduit $1110_C$, the flow being selectively maintained by the immersed backup pump $1150_B$ that extracts and returns the dielectric heat transfer fluid to and from the tank 2200.

The backup cooling arrangement $1100_C$ may also comprise a flow rate sensor 1190', similar to the flow rate sensor 1190, to sense a flow of the dielectric fluid within the open cooling loop (e.g. within the immersed fluid conduit $1150_C$). In a non-limiting embodiment, the flow rate sensor 1190' may be communicably connected to a controller (not shown) to provide data thereto, the data comprising indication of a flow of the dielectric fluid within the open cooling loop.

FIG. 5 is a schematic diagram of a cooling system 3000 in which the cooling arrangement $1100_D$ is a main cooling arrangement, the cooling system 3000 also comprising the backup cooling arrangement $1100_B$. In this embodiment, the main cooling arrangement $1100_D$ comprises the tank 2200 filled with the dielectric heat transfer fluid, the pump 2220 and the external fluid conduit 2210. The main cooling arrangement $1100_D$ may also comprise a cooling apparatus (not shown) thermally connected to the external fluid conduit 2210 to cool the dielectric heat transfer fluid. In other words, the thermal energy generated by the heat generating component 50 is primarily collected by the dielectric heat transfer fluid under normal operation conditions of the main cooling arrangement 1100$_D$.

In this embodiment, the external thermal transfer surface 1124$_B$ of the backup liquid cooling block 1140$_B$ is disposed in contact, either directly or by use of a thermal paste, with the heat generating component 50, such that the backup liquid cooling block 1140$_B$ is thermally connected thereto. As such, in the event of a rise of the temperature of the heat generating component 50 and/or of the temperature of the dielectric heat transfer fluid in a vicinity of the thermal fuse that may be, for example, due to a failure of the pump 2220, the temperature of the thermal fuse 100 rises. In response to the temperature of the thermal fuse 100 being above the melting temperature, the state of the thermal fuse 100 changes from the solid state to the melted state, thereby enabling a flow of the backup heat transfer fluid in the cooling loop of the backup cooling arrangement 1100$_B$, the flow being maintained by the backup pump 1150$_B$. Therefore, thermal energy generated by the heat generating component 50 that may not be properly collected by the dielectric heat transfer fluid of the main cooling arrangement 1100$_D$ is collected by the backup heat transfer fluid flowing in the internal conduit 110$_B$ of the backup liquid cooling block 1140$_B$. It is contemplated that the pump 2220 may be mounted in the tank 2200 and submerged in the dielectric heat transfer fluid.

As described with respect to FIG. 4, the backup cooling arrangement 1100$_B$ of the cooling system 3000 comprises the controller 20 and the temperature sensor 1195 for sensing a temperature of the heat generating component 50, the temperature sensor 1195 being communicably connected to the controller 20. The backup pump 1150$_B$ is communicably connected to the controller 20 such that the controller 20 may, in response to the temperature sensor 1195 sensing a temperature of the heat generating component 50 above the heat generating component temperature threshold (e.g. set according to the melting temperature of the thermal fuse 100), actuate the backup pump 1150$_B$.

In this embodiment, a plurality of fins 1145E may be disposed on an upper surface of the backup liquid cooling block 1140$_B$, the upper surface being opposed to the external thermal transfer surface 1124$_B$, the plurality of fins 1145$_B$ facilitating dissipation of thermal energy collected by the backup heat transfer fluid into the dielectric heat transfer fluid flowing in the tank 2200. Additionally or optionally, a layer of a porous material (not shown) may be disposed on the upper surface of the backup liquid cooling block 1140$_B$, the porous material being made of a material selected such that nucleate boiling of the porous material arises in response to the temperature of the backup heat transfer fluid being higher than a boiling temperature threshold. Thermal energy may thus be transferred from the backup heat transfer fluid to the dielectric heat transfer fluid via nucleate boiling of the porous material.

FIG. 6 is a schematic diagram of a cooling system 4000 in which the cooling arrangement 1100$_D$ is a main cooling arrangement, the cooling system 4000 also comprising a backup cooling arrangement 1100$_E$. In this embodiment, the heat generating component 50 is at least partially immersed within the tank 2200 with the dielectric heat transfer fluid. The backup cooling arrangement 1100$_E$ comprises a fluid conduit 2110 defining a fluid inlet 2112 and a fluid outlet 2114, the fluid conduit 2110 being immersed within the tank 2200. The backup cooling arrangement 1100$_E$ further comprises a backup pump 2120 immersed in the dielectric heat transfer fluid and configured for maintaining a flow of the dielectric heat transfer fluid within the fluid conduit 2110.

In this embodiment, the thermal fuse 100 is initially disposed in its solid state within the fluid conduit 2110 such that the flow of the dielectric heat transfer fluid within the fluid conduit 2110 is opposed by the thermal fuse 100. In response to the temperature of the thermal fuse 100 being higher than its melting temperature (e.g. due to overheating of the heat generating component 50 and/or a failure of the main cooling arrangement 1100$_D$), the thermal fuse 100 melts such that a flow of the dielectric heat transfer fluid is enabled in fluid conduit 2110 and maintained by the backup pump 2120. The thermal fuse may be disposed at any point within the fluid conduit 2110.

Upon the thermal fuse 100 being melted, the fluid conduit 2110, in collaboration with the backup pump 2120, causes the dielectric heat transfer fluid of the tank 2200 to be directed from the fluid outlet 2114 to the fluid inlet 2112, the fluid inlet 2112 being located in a vicinity of the heat generating component 50 such that a collection of thermal energy generated therefrom may be facilitated. Indeed, the fluid conduit 2110 and the backup pump 2120 may increase a fluid velocity of the dielectric heat transfer fluid around the heat generating component, thereby accelerating thermal energy carriage by the dielectric fluid in a vicinity of the heat generating component 50.

In this embodiment, the backup cooling arrangement 1100$_E$ comprises a controller 20″ that may be similar to the controller 20, and a temperature sensor 1995″ for sensing a temperature of the heat generating component 50, the temperature sensor 1995″ being communicably connected to the controller 20″. The backup pump 2120 is communicably connected to the controller 20″, the controller 20″ actuating the backup pump 2120 in response to the temperature sensor 1195″ sensing a temperature of the heat generating component 50 being above the heat generating component temperature threshold (e.g. set according to the melting temperature of the thermal fuse 100).

The backup cooling arrangement 1100$_E$ also comprise a flow rate sensor 1190″, similar to the flow rate sensor 1190, to sense a flow of the dielectric fluid within the fluid conduit 2110. In a non-limiting embodiment, the flow rate sensor 1190″ may be communicably connected to the controller 20″ to provide data thereto, the data comprising indication of a flow of the dielectric fluid within the open cooling loop.

The backup cooling arrangement 1100$_E$ may also comprise a flow rate sensor (not shown), similar to the flow rate sensor 1190, to sense a flow of the dielectric fluid within the fluid conduit 2110. In a non-limiting embodiment, the flow rate sensor may be communicably connected to the controller 20″ to provide data thereto, the data comprising indication of a flow of the dielectric fluid within the fluid conduit 2110.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling system for cooling a heat generating component, the cooling system comprising:

a main cooling arrangement thermally coupled to the heat generating component, and configured for collecting thermal energy of the heat generating component via a main heat transfer fluid; and a backup cooling arrangement thermally coupled to the main cooling arrangement, the backup cooling arrangement comprising:
 at least one fluid path configured for conducting a backup heat transfer fluid;
 a thermal fuse disposed within at least a portion of the at least one fluid path, the thermal fuse changing from a solid state to a melted state and selectively enabling a flow of the backup heat transfer fluid in the at least one fluid path of the backup cooling arrangement in response to its temperature being above a temperature threshold, the backup heat transfer fluid being configured to, upon flowing in the at least one fluid path, collect thermal energy from the main cooling arrangement.

2. The cooling system of claim 1, wherein the at least one fluid path of the backup cooling arrangement comprises a backup cooling loop, the thermal fuse being disposed within the backup cooling loop, the backup cooling loop comprising:
 a backup liquid cooling block having a backup internal fluid conduit, the backup liquid cooling block being thermally coupled to the main cooling arrangement; and
 a backup pump fluidly connected to the backup internal fluid conduit, the backup pump being configured for causing the backup heat transfer fluid to flow within the backup cooling loop.

3. The cooling system of claim 2, wherein the thermal fuse is disposed within the backup internal fluid conduit, the thermal fuse being configured to inhibit the flow of the backup heat transfer fluid within the backup internal fluid conduit in response to an initial temperature of the thermal fuse being below the temperature threshold upon being disposed within the backup internal fluid conduit.

4. The cooling system of claim 2, wherein the thermal fuse is disposed at an inlet of the backup internal fluid conduit, the thermal fuse being configured to inhibit the flow of the backup heat transfer fluid within the backup internal fluid conduit in response to an initial temperature of the thermal fuse being below the temperature threshold upon being disposed within the backup internal fluid conduit.

5. The cooling system of claim 2, wherein the main cooling arrangement comprises a main cooling loop comprising:
 a main liquid cooling block having a main internal fluid conduit, the main liquid cooling block being thermally coupled to the heat generating component such that, in use, thermal energy of the heat generating component is collected by the main heat transfer fluid flowing in the main internal fluid conduit; and
 a main pump fluidly connected to the main internal fluid conduit, the main pump being configured for causing the main heat transfer fluid to flow within the main cooling loop,
 and wherein the backup liquid cooling block is coupled to a surface of the main liquid cooling block.

6. The cooling system of claim 1, wherein the backup heat transfer fluid is a dielectric heat transfer fluid, the backup cooling arrangement further comprising:
 a tank filled with the dielectric heat transfer fluid for immersive cooling of the heat generating component, the heat generating component being disposed within the tank such that thermal energy generated therefrom is collected by the dielectric heat transfer fluid; and
 an immersive cooling pump configured for causing the dielectric heat transfer fluid to flow within the tank, the dielectric heat transfer fluid flowing in the at least one fluid path being extracted from the tank by the immersive cooling pump.

7. The cooling system of claim 6, wherein the backup cooling arrangement is an open cooling loop fluidly connected to the tank.

8. The cooling system of claim 6, wherein the immersive cooling pump is configured to cause a flow of the dielectric heat transfer fluid in an external fluid conduit from a surface of the tank to a tank inlet, the tank inlet being located at a bottom of the tank.

9. The cooling system of claim 8, further comprising a cooling apparatus configured to extract heat from the external fluid conduit to cool the dielectric heat transfer fluid before entering the tank at the tank inlet.

10. The cooling system of claim 8, wherein the backup heat transfer fluid flowing in the at least one fluid path is extracted from the tank by the immersive cooling pump at the tank inlet.

11. The cooling system of claim 1, wherein the main heat transfer fluid is a dielectric heat transfer fluid, the main cooling arrangement further comprising:
 a tank filled with the dielectric heat transfer fluid for immersive cooling of the heat generating component, the heat generating component being disposed within the tank such that thermal energy generated therefrom is collected by the dielectric heat transfer fluid; and
 an immersive cooling pump configured for causing the dielectric heat transfer fluid to flow within the tank.

12. The cooling system of claim 11, wherein the immersive cooling pump is configured to cause a flow of the dielectric heat transfer fluid in an external fluid conduit from a surface of the tank to a tank inlet, the tank inlet being located at a bottom of the tank.

13. The cooling system of claim 12, further comprising a cooling apparatus configured to extract heat from the external fluid conduit to cool the dielectric heat transfer fluid before entering the tank at the tank inlet.

14. The cooling system of claim 1, wherein:
 the main and backup heat transfer fluids are a same dielectric heat transfer fluid, and
 the main cooling arrangement comprises:
  a tank filled with the dielectric heat transfer fluid for immersive cooling of the heat generating component, the heat generating component being disposed within the tank such that thermal energy generated therefrom is collected by the dielectric heat transfer fluid; and
  an immersive cooling pump configured for causing the dielectric heat transfer fluid to flow within the tank;
 the at least one fluid path of the backup cooling arrangement being immersed within the tank and being fluidly connected therewith, the backup cooling arrangement further comprising a backup pump configured for causing the dielectric heat transfer fluid to flow within the at least one fluid path.

15. The cooling system of claim 1, wherein the thermal fuse comprises a phase change material.

16. The cooling system claim 15, wherein the phase change material comprises paraffin wax.

17. The cooling system of claim 1, wherein the backup cooling arrangement further comprises a flow rate sensor configured for sensing a flow of the backup heat transfer fluid in the at least one fluid path, the flow rate sensor being communicably connected to a controller.

18. The cooling system of claim 17, wherein the flow rate sensor is configured for providing to the controller a signal indicative of a flow of the backup heat transfer fluid in the at least one fluid path.

19. The cooling system of claim 1, wherein the backup cooling arrangement further comprises a temperature sensor configured for sensing a temperature of the heat generating component, the temperature sensor being communicably connected to a controller and provide the controller with a signal to the controller in response to the temperature of the heat generating component being higher than the temperature threshold.

20. The cooling system of claim 1, wherein the thermal fuse is dissolved in the backup heat transfer fluid in response to its temperature being higher than the temperature threshold.

* * * * *

UNITED STATES PATENT AND TRADEMARK OFFICE
CERTIFICATE OF CORRECTION

| | |
|---|---|
| PATENT NO. | : 12,137,536 B2 |
| APPLICATION NO. | : 17/697264 |
| DATED | : November 5, 2024 |
| INVENTOR(S) | : Alexandre Alain Jean-Pierre Meneboo et al. |

Page 1 of 1

It is certified that error appears in the above-identified patent and that said Letters Patent is hereby corrected as shown below:

In the Claims

Column 14, Claim 16, Line 63 should read --The cooling system of claim 15, wherein the phase--

Column 15, Claim 19, Line 11 should read --connected to a controller and providing the controller with a--

Signed and Sealed this
Thirty-first Day of December, 2024

Derrick Brent
*Acting Director of the United States Patent and Trademark Office*